(12) United States Patent
Akama et al.

(10) Patent No.: US 7,559,771 B2
(45) Date of Patent: Jul. 14, 2009

(54) CONTACT MEMBER AND CONNECTOR INCLUDING SAME

(75) Inventors: Junichi Akama, Shinagawa (JP); Toshihiro Kusagaya, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 12/267,640

(22) Filed: Nov. 10, 2008

(65) Prior Publication Data

US 2009/0156022 A1    Jun. 18, 2009

(30) Foreign Application Priority Data

Dec. 17, 2007    (JP) .............. 2007-324955

(51) Int. Cl.
*H01R 12/00*    (2006.01)
(52) U.S. Cl. ........................................ 439/66
(58) Field of Classification Search .............. 439/66
See application file for complete search history.

(56) References Cited

U.S. PATENT DOCUMENTS 5,167,512 A * 12/1992 Walkup ................ 439/66
6,517,362 B2 * 2/2003 Hirai et al. .............. 439/82
7,014,473 B2 * 3/2006 Millard et al. ........... 439/66

FOREIGN PATENT DOCUMENTS

| JP | 56-008837 | 1/1981 |
|---|---|---|
| JP | 2001-235486 | 8/2001 |
| JP | 2005-129428 | 5/2005 |

* cited by examiner

*Primary Examiner*—Briggitte R Hammond
(74) *Attorney, Agent, or Firm*—IPUSA, PLLC

(57) ABSTRACT

A contact member is disclosed that includes a trunk part into which a strip-shaped part is formed substantially annularly; a first contact part at a first end of the trunk part; and a second contact part at a second end of the trunk part, the second contact part being positioned inside the first contact part. The first contact part and the second contact part face each other. The strip-shaped part is configured to be elastically twisted to cause the second contact part to come into contact with the first contact part in response to the second contact part being pressed in a direction of the axis of the trunk part. The strip-shaped part includes multiple turn-around parts between the first contact part and the second contact part.

8 Claims, 18 Drawing Sheets

D10 > D0

H10 < H0

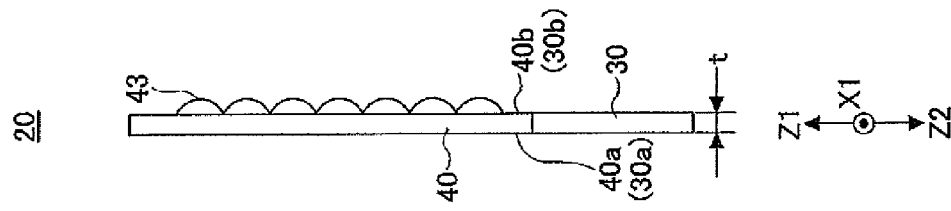
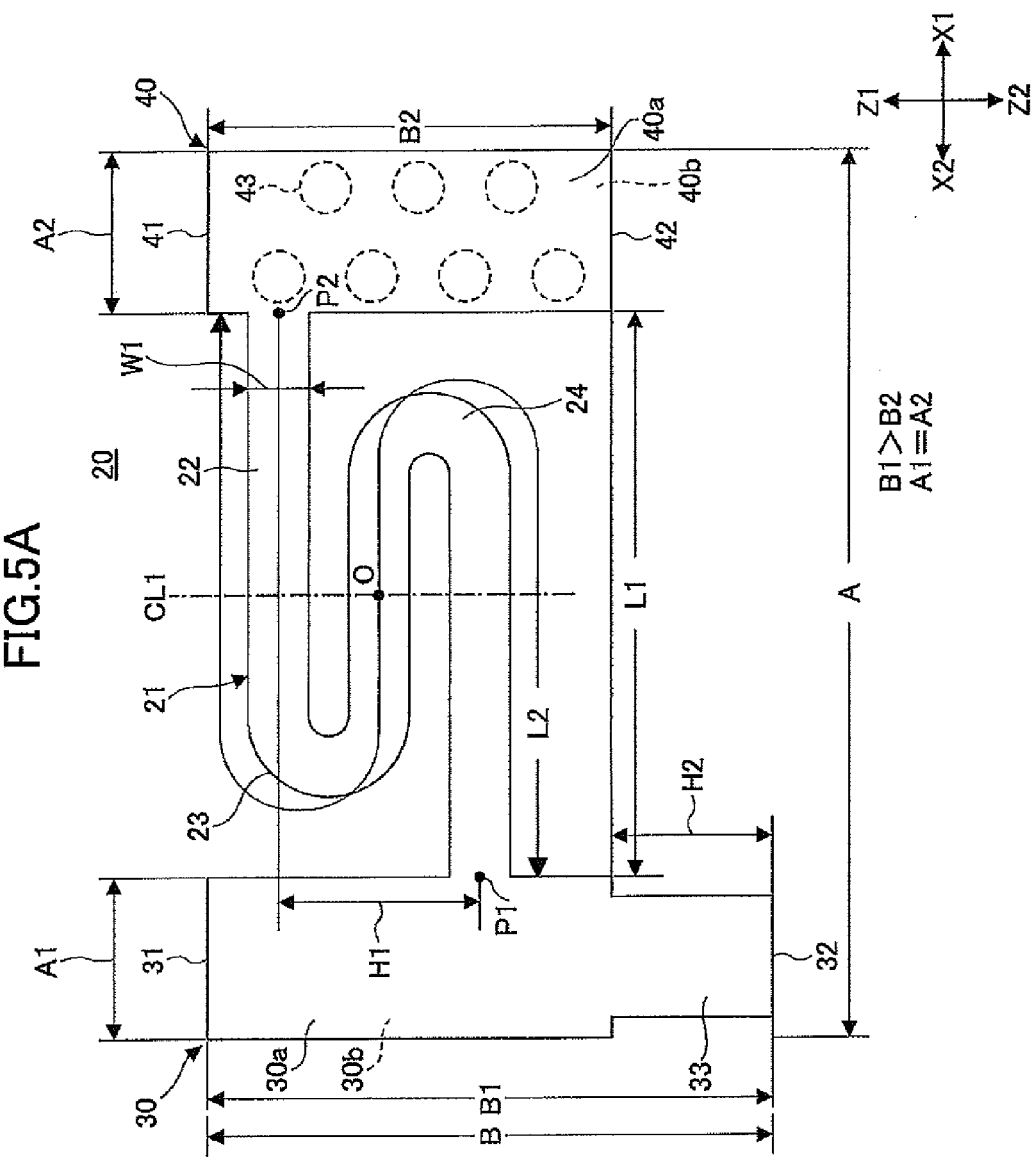

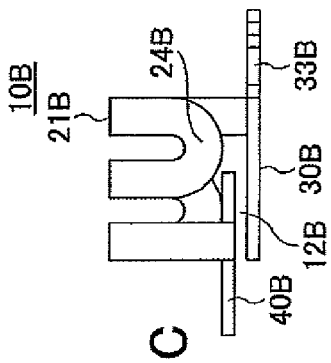
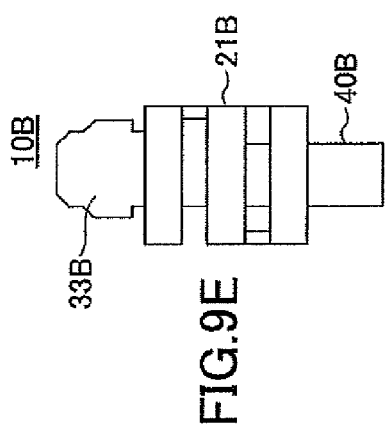
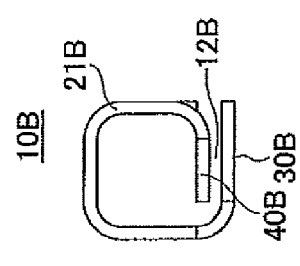
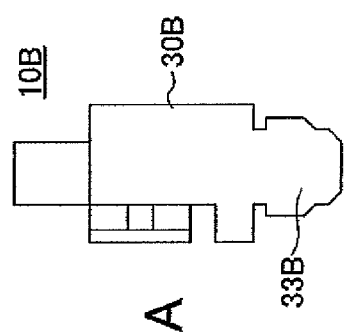
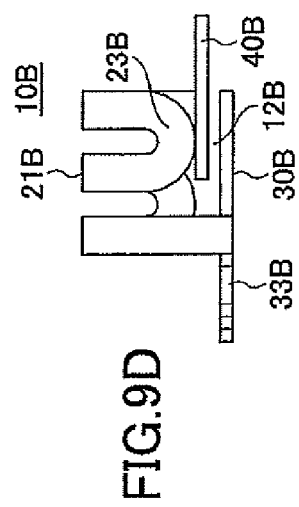

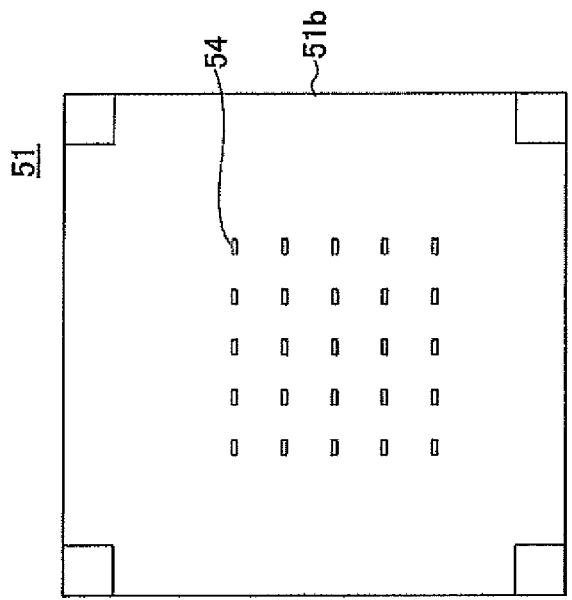
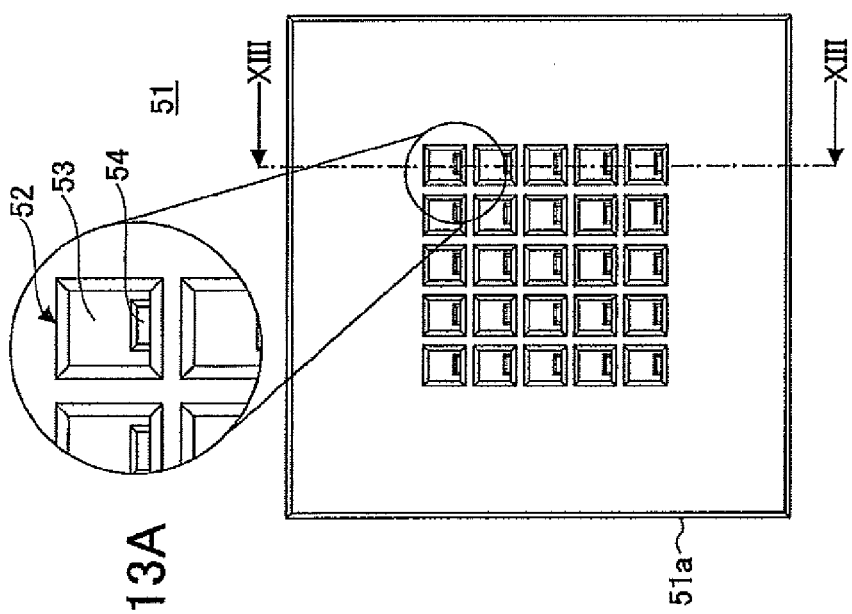
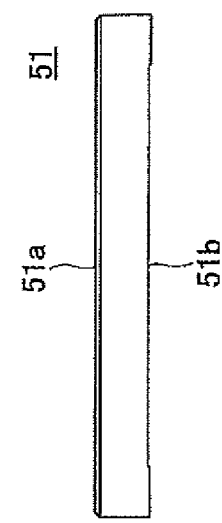

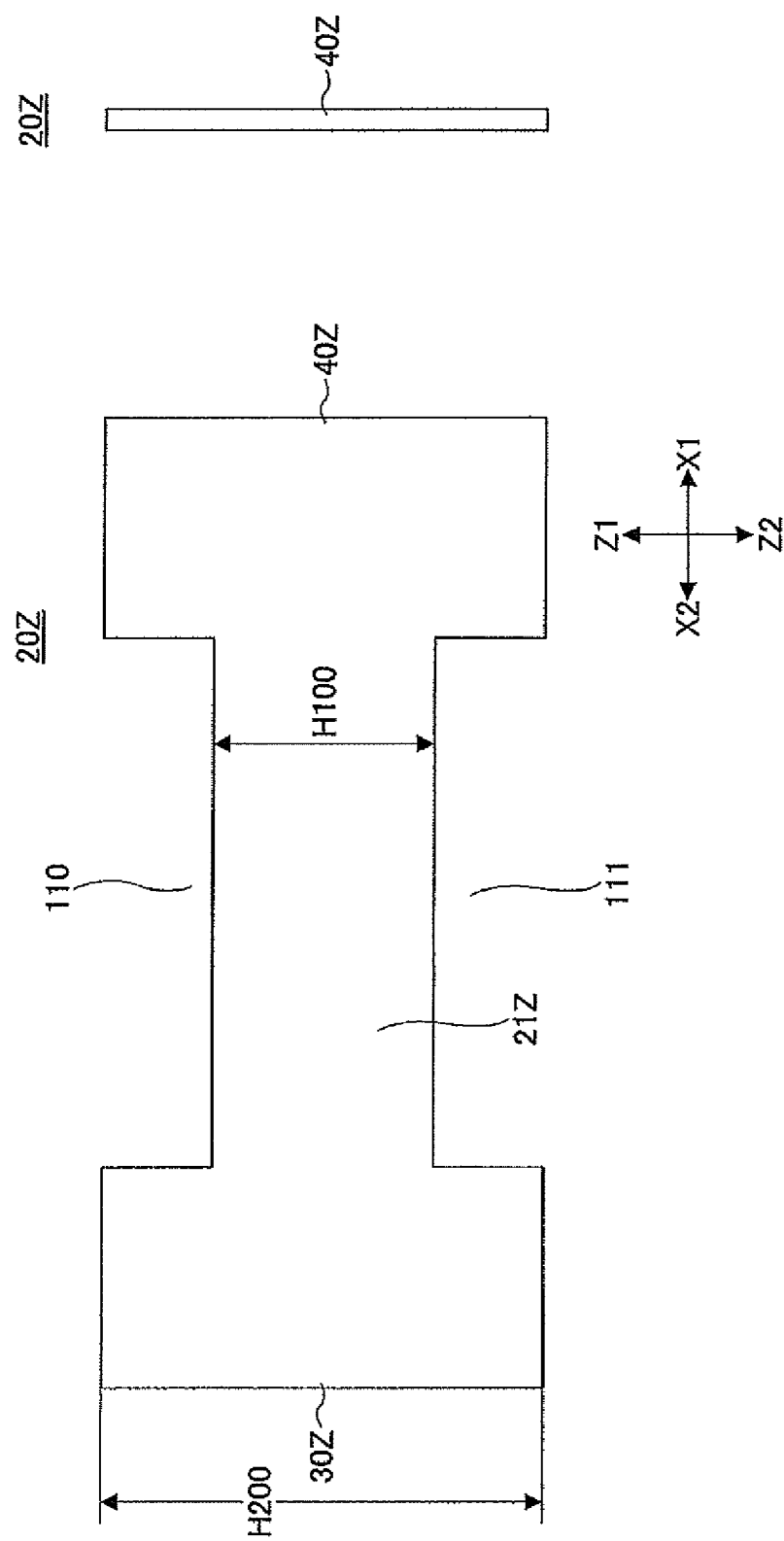
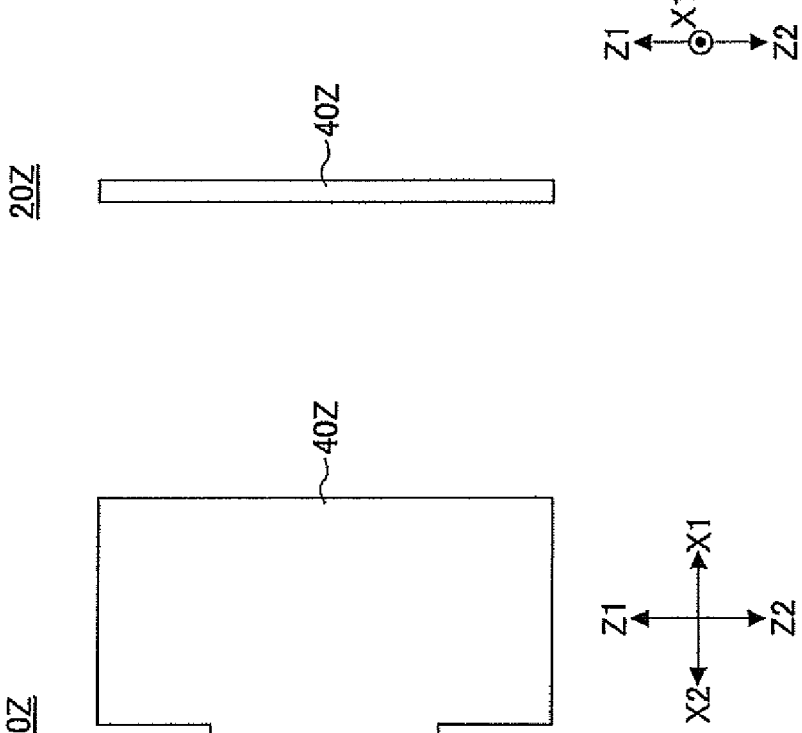
FIG.18A
FIG.18B

CONTACT MEMBER AND CONNECTOR INCLUDING SAME

BACKGROUND OF THE INVENTION

1. Field of the Invention

The present invention relates generally to contact members and connectors, and more particularly to a contact member used in, for example, part of a connector for an IC package (an IC package connector) used in mounting an LGA (Land Grid Array) or BGA (Ball Grid Array) IC package on a circuit board and to a connector including the contact member.

2. Description of the Related Art

An IC package connector is used to mount an LGA or BGA IC package in an easily replaceable manner. The IC package connector is required to be more reliable with a recent increase in the size and speed of data transmission. An increase in data transmission speed makes it necessary to consider the effect of contact inductance. In recent years, the data transmission speed is on the order of magnitude of 10 Hz, so that the inductance of contacts in the IC package connector is required to be on the order of magnitude of 1 nanoHenry (nH) in order for data to be normally transmitted. Further, the contacts are required to be elastically deformable when in use. Further, the contacts are required to be reduced in size so as to correspond to the pad arrangement pitch of the IC package.

FIGS. 1A and 1B are diagrams showing a conventional contact member 1. The contact member 1 has a helical volute spring structure with multiple turns. When in use, the contact member 1 is compressed to generate a repulsive force with a helical signal transmission channel.

For conventional art, reference may be made to the following, for example.

[Patent Document 1] Japanese Laid-Open Patent Application No. 56-8837

[Patent Document 2] Japanese Laid-Open Patent Application No. 2001-235486

[Patent Document 3] Japanese Laid-Open Patent Application No. 2005-129428

However, although generating a resilient repulsive force, the contact member 1 shown in FIGS. 1A and 1B is not low in inductance because of the helical signal transmission channel, thus being unsuitable for a point of high-speed data transmission. Further, since the contact member 1 is not small, the contact member 1 is not suitable as a contact member for a connector whose contact members are required to be arranged with a small pitch, such as an IC package connector.

SUMMARY OF THE INVENTION

Embodiments of the present invention may solve or reduce one or more of the above-described problems.

According to one embodiment of the present invention, a contact member is provided in which one or more of the above-described problems may be solved or reduced.

According to one embodiment of the present invention, a connector including the contact member is provided.

According to one embodiment of the present invention, a contact member is provided that includes a trunk part into which a strip-shaped part is formed substantially annularly, a first contact part at a first end of the trunk part, and a second contact part at a second end of the trunk part, the second contact part being positioned inside the first contact part, wherein the first contact part and the second contact part face each other, the strip-shaped part is configured to be elastically twisted to cause the second contact part to come into contact with the first contact part in response to the second contact part being pressed in a direction of an axis of the trunk part, and the strip-shaped part includes a plurality of turn-around parts between the first contact part and the second contact part.

According to one embodiment of the present invention, a connector is provided that includes a contact member including a trunk part into which a strip-shaped part is formed substantially annularly, a first contact part at a first end of the trunk part, and a second contact part at a second end of the trunk part, the second contact part being positioned inside the first contact part, wherein the first contact part and the second contact part face each other, the strip-shaped part is configured to be elastically twisted to cause the second contact part to come into contact with the first contact part in response to the second contact part being pressed in a direction of an axis of the trunk part, and the strip-shaped part includes a plurality of turn-around parts between the first contact part and the second contact part; and a connector main body including a hole part corresponding to the trunk part of the contact member, wherein the contact member is incorporated in the connector main body with the trunk part of the contact member being contained in the hole part.

According to the above-described contact member and the connector, the turn-around parts increase the overall length of the strip-shaped part without increasing the distance between the first (outside) contact part and the second (inside) contact part. Accordingly, when the second contact part is pressed in a direction of the axis of the trunk part until the second contact part comes into contact with the first contact part so that the strip-shaped part is elastically twisted, the strip-shaped part is less likely to cause plastic deformation. Therefore, the contact member enjoys good spring characteristics.

BRIEF DESCRIPTION OF THE DRAWINGS

Other objects, features and advantages of the present invention will become more apparent from the following detailed description when read in conjunction with the accompanying drawings, in which:

FIGS. 5A and 5B are diagrams showing the contact member in a developed state according to the first embodiment of the present invention;

FIGS. 9A through 9E are diagrams showing the contact member according to the second embodiment of the present invention;

FIGS. 13A through 13D are diagrams showing a connector main body of the LGA IC package connector according to the second embodiment of the present invention;

FIGS. 18A and 18B are diagrams showing the contact member in a developed state according to the fourth embodiment of the present invention.

DETAILED DESCRIPTION OF THE PREFERRED EMBODIMENTS

A description is given below, with reference to the accompanying drawings, of embodiments of the present invention.

First Embodiment

FIG. 2, FIGS. 3A and 3B, and FIGS. 4A and 4B are diagrams showing a contact member 10 according to a first embodiment of the present invention.

Figure 1A:
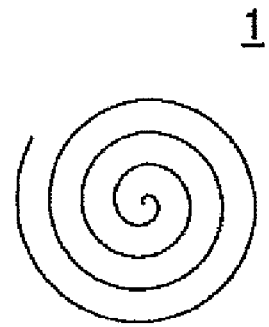
FIGS. 1A and 1B are diagrams showing a conventional contact member.
Figure 1B:
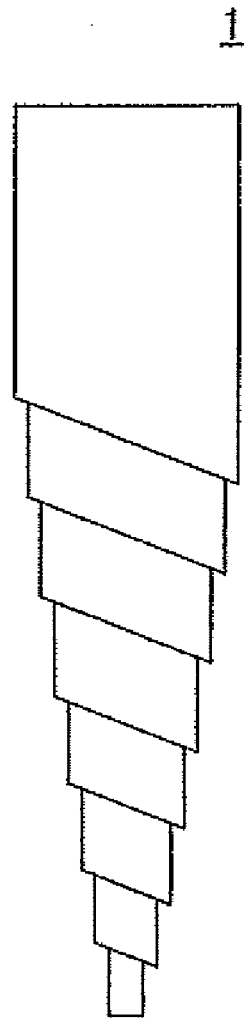
Figure 2:
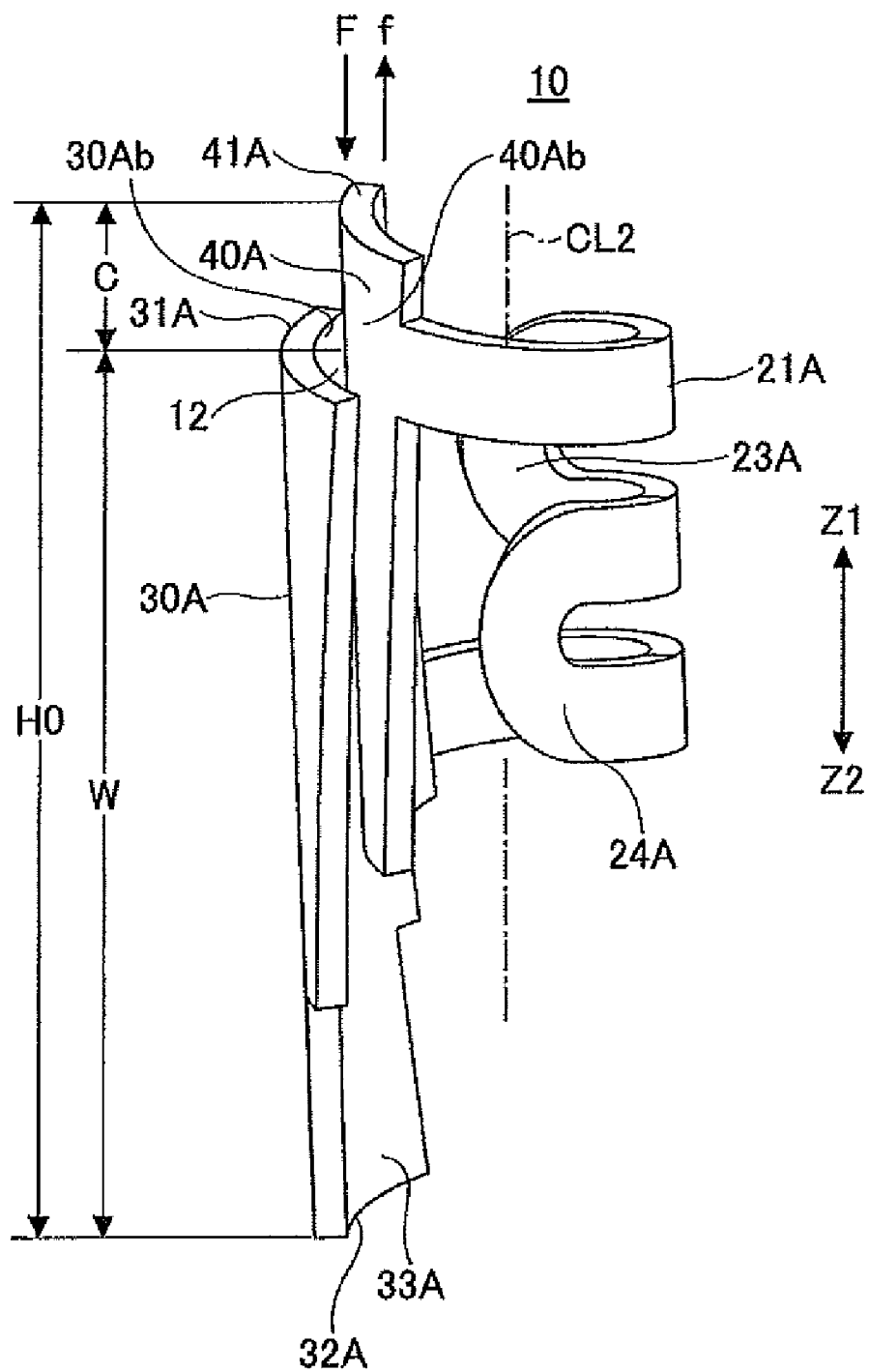
FIG. 2 is a perspective view of a contact member according to a first embodiment of the present invention.
Figure 3A:
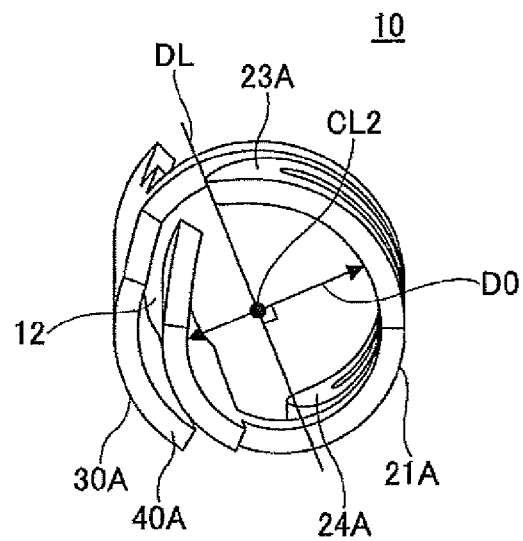
FIGS. 3A and 3B are a plan view and a front view, respectively, of the contact member according to the first embodiment of the present invention.
Figure 3B:
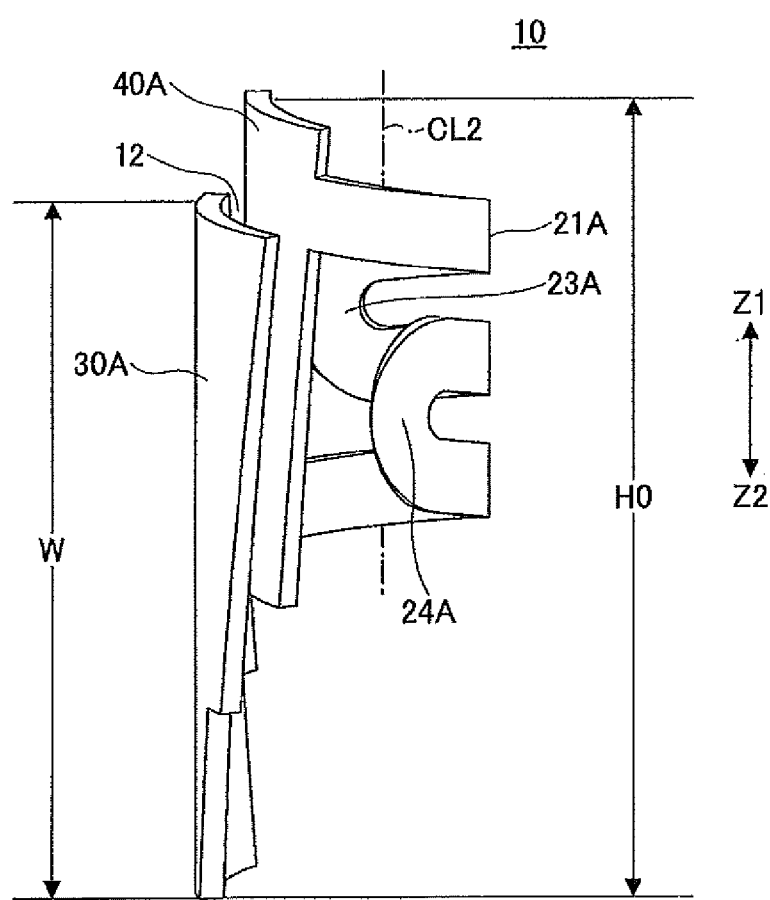
Figure 4A:
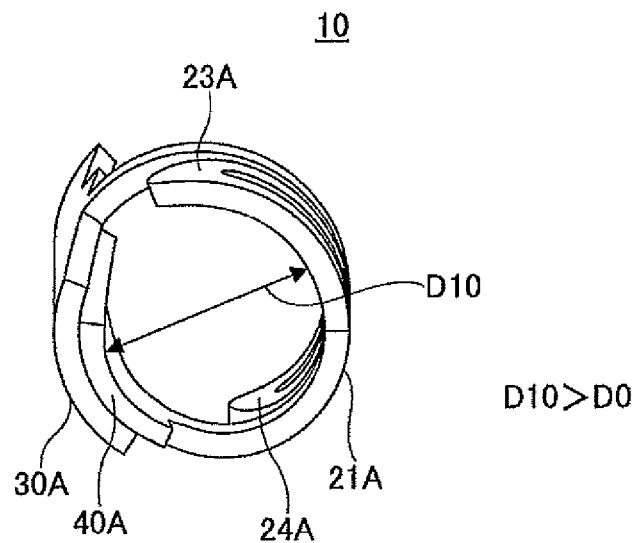
FIGS. 4A and 4H are a plan view and a front view, respectively, of the contact member compressed to have an inside contact part and an outside contact part in contact with each other according to the first embodiment of the present invention.
Figure 4B:
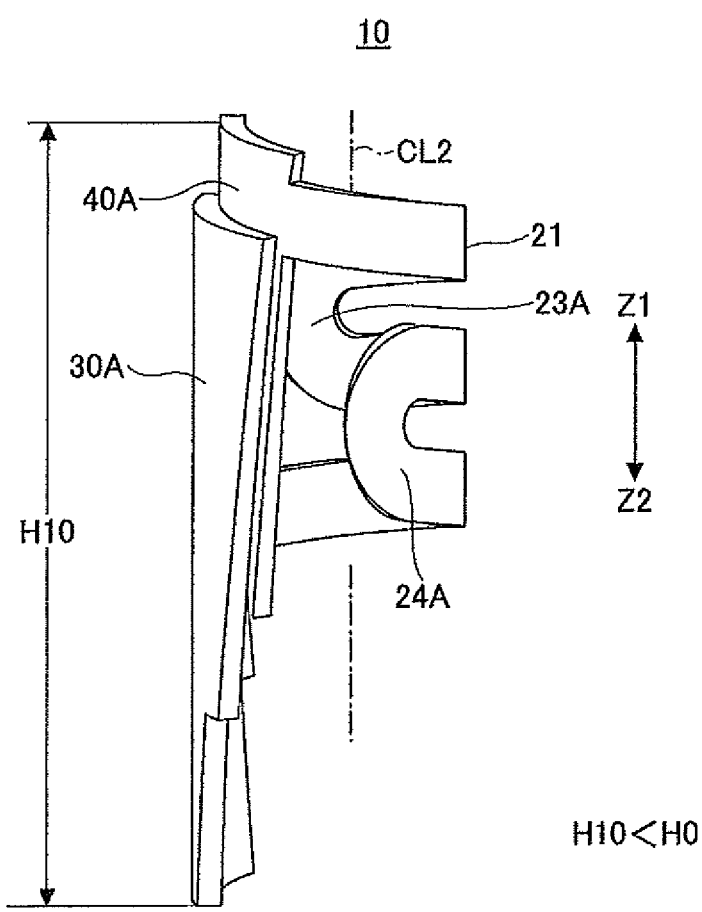

FIG. 2 is a perspective view, FIGS. 3A and 4A are plan views, and FIGS. 3B and 4B are front views, respectively, of the contact member 10.

FIG. 2 and FIGS. 3A and 3B show the contact member 10 in a natural state with no external force acting thereon. FIGS. 4A and 4B show the contact member 10 elastically deformed in response to an applied external force when the contact member 10 is in use.

The contact member 10 has a substantially cylindrical shape, and is extremely small with an inside diameter D0 (FIG. 3A) of approximately 0.5 mm and an axial length H0 (FIG. 3B) of approximately 1.5 mm.

FIGS. 5A and 5B are diagrams showing a developed plate member 20 to be formed into the contact member 10, that is, the developed contact member 10.

The developed plate member 20 is blanked out into a predetermined shape from a phosphor bronze or stainless steel plate having a thickness t of approximately 0.05 mm with a press. The developed plate member 20 has a horizontally long general outline that fits into a rectangular range of a horizontal dimension A and a vertical dimension B. In FIG. 5A, X1-X2 indicates the horizontal directions, and Z1-Z2 indicates the vertical directions. Referring to FIG. 5A, the developed plate member 20 includes a trunk part formation planned part 21 to form a below-described trunk part 21A (for example, FIG. 2), an outside (peripheral side) contact part formation planned part 30 to form a below-described outside (peripheral side) contact part 30A (for example, FIG. 2) at the X2 end of the trunk part formation planned part 21, and an inside contact part formation planned part 40 to form a below-described inside contact part 40A (for example, FIG. 2) at the X1 end of the trunk part formation planned part 21.

The trunk part formation planned part 21 includes a strip-shaped part 22. The strip-shaped part 22 has a width W1 and a substantially S-letter shape. The strip-shaped part 22 has turn-around parts 23 and 24 in the middle, and is rotationally symmetric with respect to its center O, which is on the center line CL1 between the outside contact part formation planned part 30 and the inside contact part formation planned part 40. The overall length L2 of the strip-shaped part 22 is approximately twice the length of the length L1 between the outside contact part formation planned part 30 and the inside contact part formation planned part 40. The trunk part formation planned part 21 has its one end connected to the outside contact part formation planned part 30 at a point P1 and has its other end connected to the inside contact part formation planned part 40 at a point P2. The points P1 and P2 are vertically offset by a dimension H1.

Each of the outside contact part formation planned part 30 and the inside contact part formation planned part 40 has a vertically elongated rectangular shape. The outside contact part formation planned part 30 has a horizontal (X1-X2) dimension A1 and a vertical (Z1-Z2) dimension B1, and the inside contact part formation planned part 40 has a horizontal (X1-X2) dimension A2 and a vertical (Z1-Z2) dimension B2, where B1>B2 and A1=A2. Thus, the outside contact part formation planned part 30 is vertically longer than the inside contact part formation planned part 40.

The outside contact part formation planned part 30 and the inside contact part formation planned part 40 have respective front (first) surfaces 30a and 40a to serve as inner surfaces when the developed plate member 20 is cylindrically shaped, and have respective back (second) surfaces 30b and 40b to serve as outer surfaces when the developed plate member 20 is cylindrically shaped.

Upper ends 31 and 41 of the outside contact part formation planned part 30 and the inside contact part formation planned part 40 are at the same vertical (Z1-Z2) position (vertically at the same level). A lower end 32 of the outside contact part formation planned part 30 projects in the Z2 direction by a dimension H2 relative to a lower end 42 of the inside contact part formation planned part 40, and defines a leg part formation planned part 33. Multiple hemispheric projecting parts 43 are formed in a staggered (zigzag) arrangement on the surface 40b of the inside contact part formation planned part 40.

The contact member 10 is formed by helically winding the developed plate member 20 approximately 1.3 turns so that the outside contact part formation planned part 30 and the inside contact part formation planned part 40 circumferentially overlap each other and that the inside contact part formation planned part 40 is offset in the Z1 direction relative to the outside contact part formation planned part 30.

Referring to FIG. 2 and FIGS. 3A and 3B, the contact member 10 includes the trunk part 21A having a substantially annular shape into which the strip-shaped part 22 that is the trunk part formation planned part 21 is wound approximately one time, the outside contact part 30A at one end of the trunk part 21A, and the inside contact part 40A at the other end of the trunk part 21A. In the drawings, CL2 denotes the axis of the trunk part 21A of the contact member 10.

As shown in FIG. 2 and FIGS. 3A and 3B, the trunk part 21A has turn-around parts 23A and 24A between the outside contact part 30A and the inside contact part 40A. Referring to FIG. 3A, the turn-around parts 23A and 24A are placed on a line DL perpendicular to the inside diameter D0 passing through the center of the trunk part 21A in the directions in which the outside contact part 30A and the inside contact part 40A overlap, and are positioned on substantially opposite sides of the center of the trunk part 21A in the directions of the diameter of the trunk part 21A along the line DL. That is, the turn-around parts 23A and 24A are symmetrically arranged with respect to the line indicating the inside diameter D0 in FIG. 3A.

Referring to FIG. 3A, the outside contact part 30A and the inside contact part 40A each have an arc shape, and are positioned on the peripheral side and the center side, respectively, to face each other across a gap 12 as narrow as approximately 0.05 mm.

Further, referring to FIG. 2 and FIG. 3B, the inside contact part 40A and the outside contact part 30A are staggered, or imbricated, in the directions of the axis CL2 to be positioned on the Z1 side and the Z2 side, respectively, relative to each other, so that an upper end 41A of the inside contact part 40A projects in the Z1 direction by a dimension C relative to an upper end 31A of the outside contact part 30A.

Next, a description is given of the state of deformation of the contact member 10 at a time when a pressing force F is exerted on the contact member 10 in a direction to compress the contact member 10 along the axis CL2 as shown in FIG. 2.

For example, it is assumed that the pressing force F is exerted on the upper end 41A of the inside contact part 40A to press the contact member 10, supported by having a leg part 33A of the outside contact part 30A fixed, in the Z2 direction.

When the pressing force F is exerted on the contact member 10, its trunk part 21A is elastically deflected in a twisted (torsional) manner to deform in a direction to reduce the axial length H0, so that a repulsive force f is generated at the upper end 41A of the inside contact part 40A.

Figure 6:
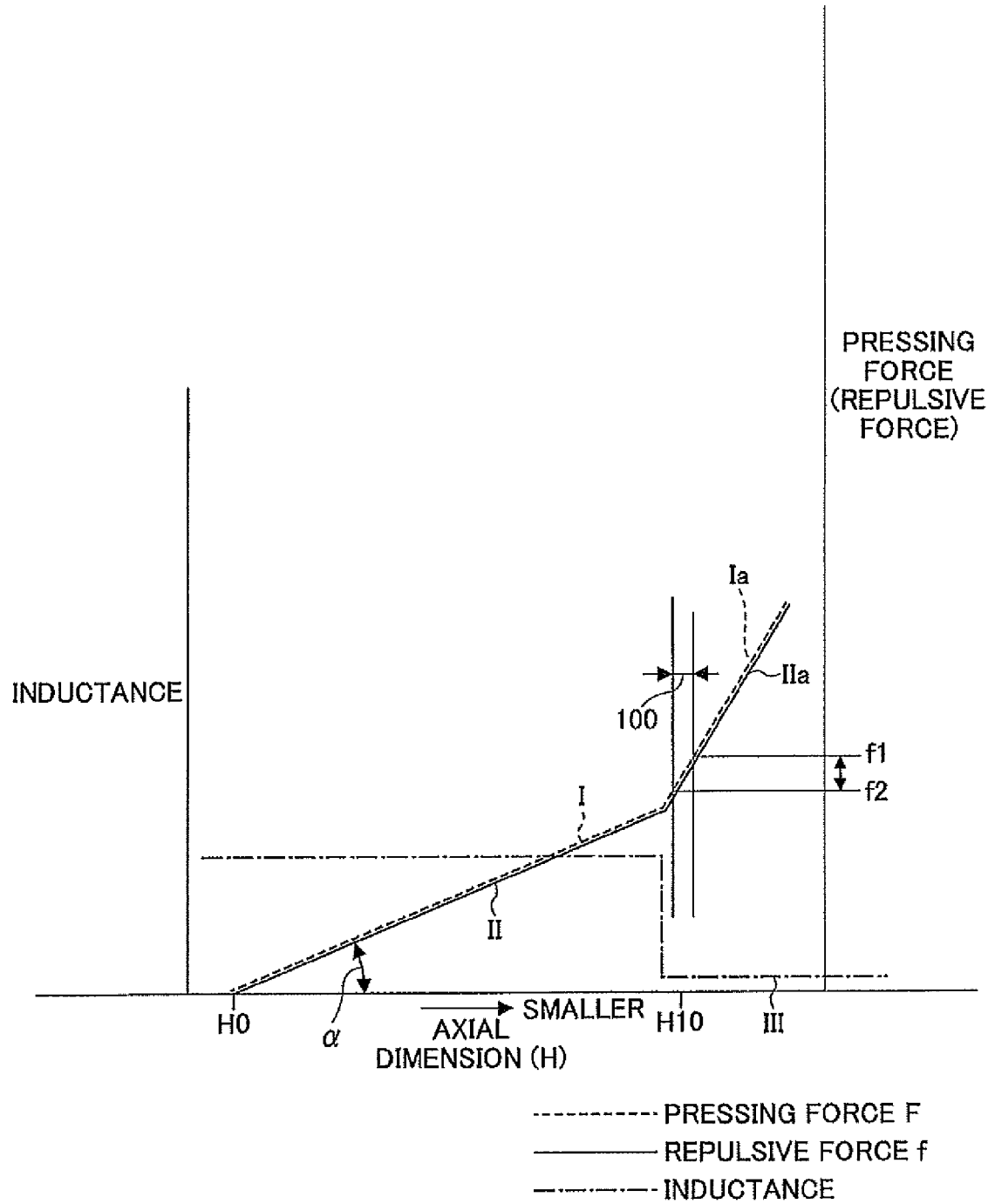
FIG. 6 is a graph showing characteristics of the contact member according to the first embodiment of the present invention.

FIG. 6 is a graph showing characteristics of the contact member 10.

The relationship between the axial dimension (length) H of the contact member 10 and the pressing force F is as indicated by Line I in FIG. 6. The relationship between the axial dimension H and the repulsive force f is as indicated by Line II in FIG. 6. That is, as the dimension H becomes smaller, the pressing force F and the repulsive force f increase proportionally at an angle $\alpha$. The angle $\alpha$ corresponds to the spring constant of the contact member 10. Actually, Line I and Line II are on top of each other, but are shown separately for convenience of description.

With deformation in the direction to reduce the axial dimension H, the helical trunk part 21A is flattened to increase the inside diameter D0, thereby bringing the inside contact part 40A closer to the outside contact part 30A. Further, the strip-shaped part 22 is twisted when the helical trunk part 21A is flattened, so that the upper end 41A of the inside contact part 40A is inclined in a direction to fall outward. As a result, the inside contact part 40A moves in a direction to approach the outside contact part 30A.

Here, as shown in FIG. 3A, the turn-around parts 23A and 24A are symmetrically arranged (arranged on the opposite sides) with respect to the inside diameter D0 in the directions in which the outside contact part 30A and the inside contact part 40A overlap. Therefore, the trunk part 21A elastically deforms evenly. Accordingly, the inside contact part 40A is prevented from unnecessarily tilting in a direction different from the direction to approach the outside contact part 30A. This also contributes to the inside contact part 40A normally approaching the outside contact part 30A.

Finally, when the axial dimension H of the contact member 10 is reduced to a length H10, the trunk part 21A has an inside diameter D10, so that an outer surface 40Ab (FIG. 2) of the inside contact part 40A is in contact with an inner surface 30Ab (FIG. 2) of the outside contact part 30A as shown in FIGS. 4A and 4B. When the inside contact part 40A comes into contact with the outside contact part 30A, the trunk part 21A is excluded from the signal transmission channel, and the inside contact part 40A and the outside contact part 30A contacting and overlapping each other along the Z1-Z2 directions form a straight signal transmission channel. As a result, the shortest signal transmission channel is formed, so that the inductance of the signal transmission channel sharply drops to be on the order of magnitude of 1 nanoHenry (nH) as indicated by Line III in FIG. 6.

When the inside contact part 40A comes into contact with the outside contact part 30A, this causes friction to sharply increase the pressing force F as indicated by Line Ia in FIG. 6. The repulsive force f also increases the same as the pressing force F as indicated by Line IIa in FIG. 6.

In FIG. 6, reference numeral 100 denotes the range of axial dimensions of the contact member 10 immediately after the inside contact part 40A comes into contact with the outside contact part 30A. The contact member 10 is used within this axial dimensional range 100. Here, the overall length L2 (FIG. 5A) of the strip-shaped part 22 is long. Therefore, even when the contact member 10 is pressed and reduced to the region 100, the trunk part 21A is prevented from having plastic deformation and maintains elastic deformation, so that the contact member 10 enjoys good spring characteristics.

Therefore, the upper end 41A of the inside contact part 40A and a lower end 32A of the outside contact part 30A are in contact with corresponding pads or contacts, being pressed against the corresponding pads or contacts with a repulsive force between f1 and f2, so that a signal is linearly transmitted from the inside contact part 40A through the outside contact part 30A. Accordingly, the contact member 10 is electrically connected to pads or solder ball grids with high reliability, and the inductance of the signal transmission channel is on the order of magnitude of 1 nanoHenry (nH).

Here, the inside contact part 40A has its multiple hemispheric projecting parts 43 come into point contact with the inner surface 30Ab of the outside contact part 30A. Therefore, compared with the case where the outer surface 40Ab of the inside contact part 40A is assumed to be flat (without the hemispheric projecting parts 43), the contact between the inside contact part 40A and the outside contact part 30A is highly reliable, so that the electrical connection between the inside contact part 40A and the outside contact part 30A is highly reliable.

Further, the above-described hemispheric projecting parts 43 may be replaced with, for example, pieces cut and raised from the inside contact part 40A.

Further, as described above, the inside contact part 40A and the outside contact part 30A are staggered in the directions of the axis CL2 to be positioned on the Z1 side and the Z2 side, respectively, relative to each other. Conversely, the inside contact part 40A and the outside contact part 30A may be staggered in the directions of the axis CL2 to be positioned on the Z2 side and the Z1 side, respectively, relative to each other.

Here, for comparison with this embodiment, a developed plate member is imagined, with reference to FIG. 5A, where the outside contact part formation planned part 30 and the inside contact part formation planned part 40 are hypothetically connected by a linear strip-shaped part of the length L1, and a contact member formed by substantially annularly shaping the developed plate member is imagined. According to this contact member, if the inside contact part 40A is compressed until the inside contact part 40A comes into contact with the outside contact part 30A (the above-described range 100), the straight strip-shaped part may exceed its elastic limit to be plastically deformed, thus resulting in poor spring characteristics.

Figure 7:
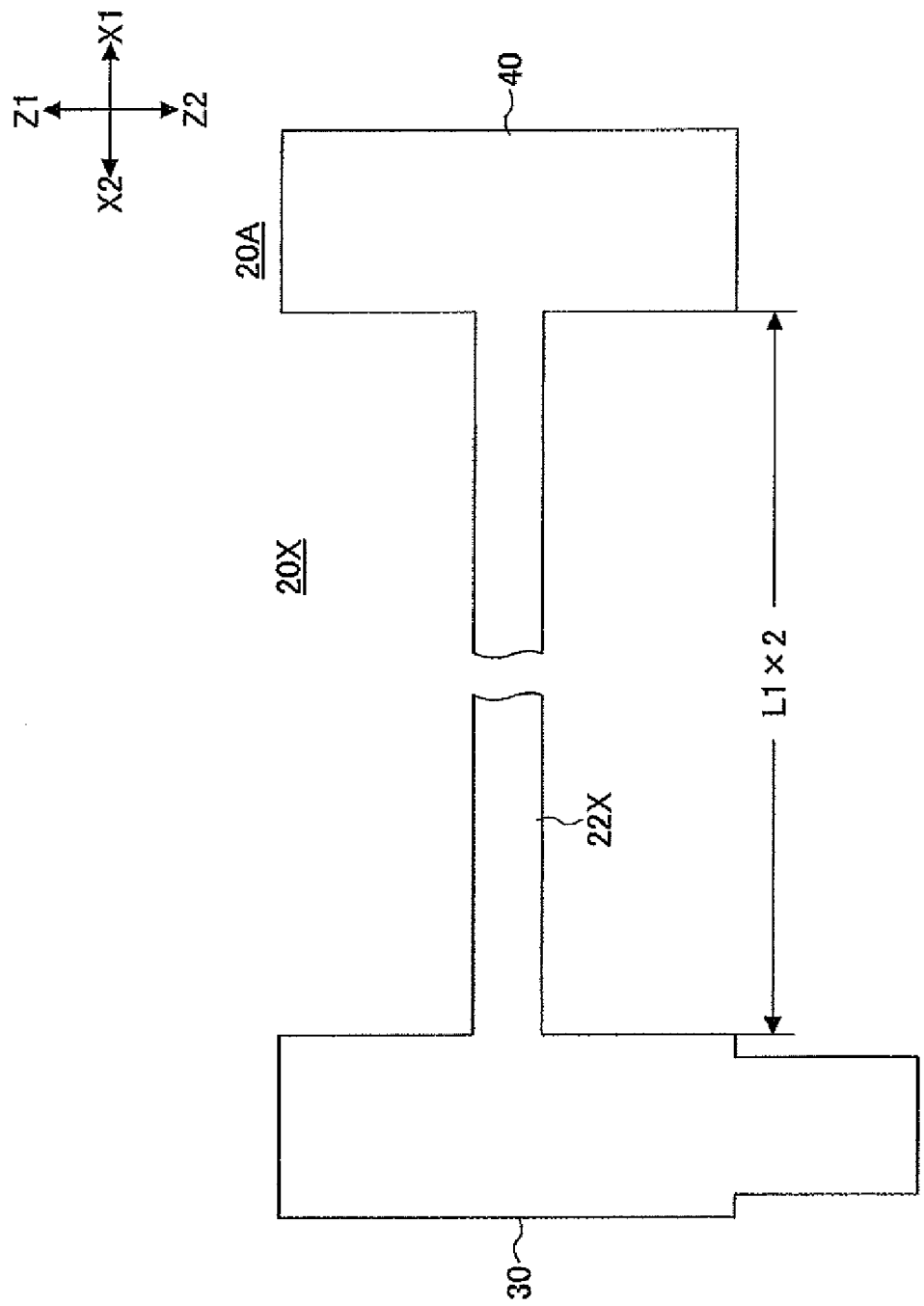
FIG. 7 is a diagram for illustrating a comparative example according to the embodiment of the present invention.

Further, a contact member is imagined, with reference to FIG. 7, formed by substantially annularly shaping a developed plate member 20X where the outside contact part formation planned part 30 and the inside contact part formation planned part 40 are connected by a linear strip-shaped part 22X twice as long as L1 (L1×2). This contact member may have spring characteristics similar to those of the contact member 10. However, the annular contact member formed by winding the developed plate member 20X one turn is large in diameter. This makes it difficult to arrange contact members with a narrow pitch, so that this contact member is not suitable for a connector or socket that requires contact members to be arranged with high density.

Second Embodiment

FIG. 8 and FIGS. 9A through 9E are diagrams showing a contact member 10B according to a second embodiment of the present invention.

Figure 8:
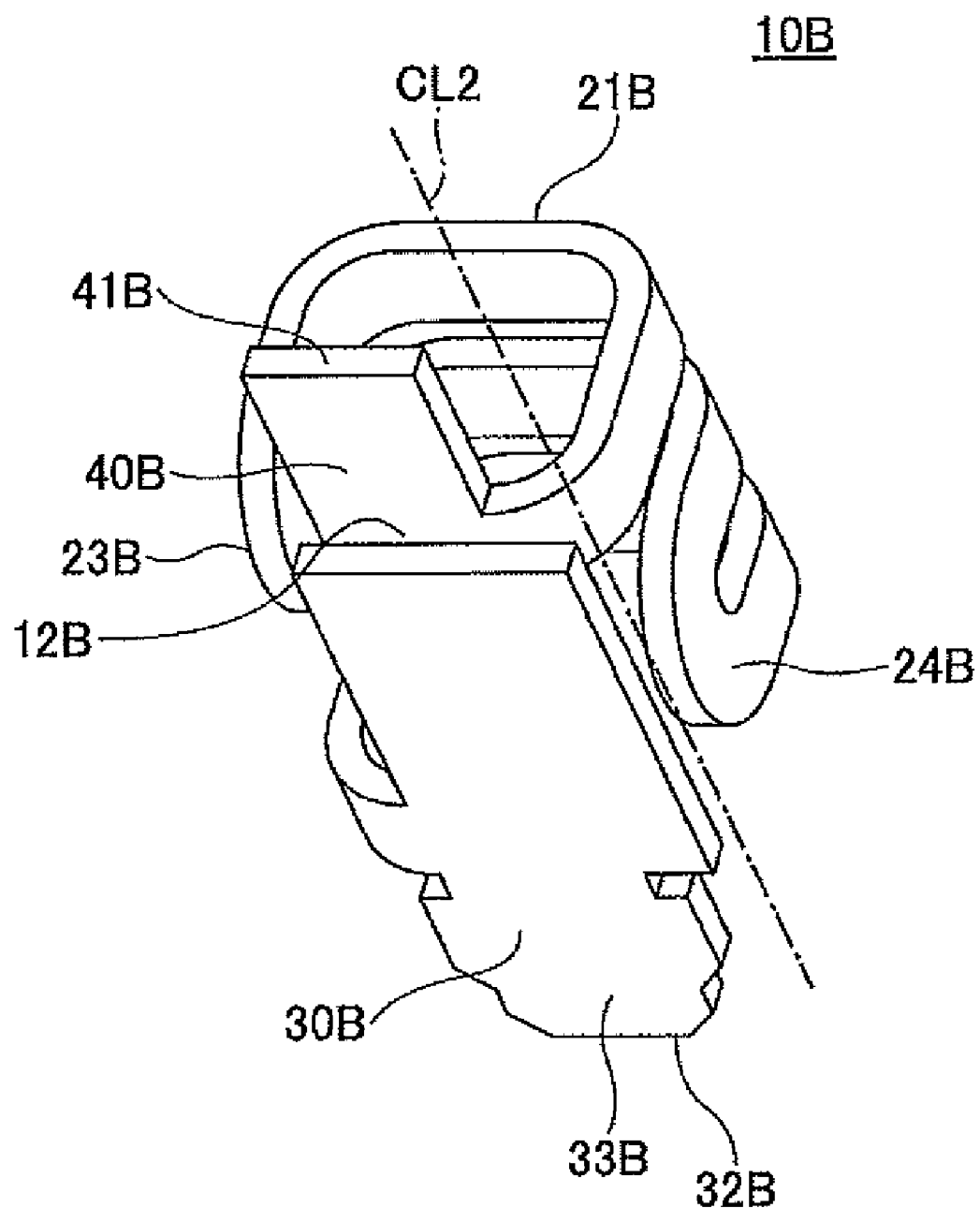
FIG. 8 is a perspective view of a contact member according to a second embodiment of the present invention.

The contact member 10B has the same configuration as the contact member 10 shown in FIG. 2 and FIGS. 3A and 3B except that a trunk part 21B of the contact member 10B has a rectangular cross section with rounded corners and that the winding (turn) is not helical but is parallel to a single plane. The contact member 10B has a substantially hollow prism shape. In FIG. 8 and FIGS. 9A and 9B, the elements corresponding to those shown in FIG. 2, FIGS. 3A and 3B, and FIGS. 4A and 4B are referred to by the same reference numerals with a suffix B.

The contact member 10B includes the trunk part 21B having a rectangular, substantially annular shape, an outside contact part 30B at one end of the trunk part 21B, and an inside contact part 40B at the other end of the trunk part 21B.

The trunk part 21B, which is formed by bending an S-letter-shaped strip-shaped part having turn-around parts to serve as turn-around parts 23B and 24B into a quadrangular prism shape, has a substantially hollow prism shape or a rectangular cylindrical shape. The outside contact part 30B and the inside contact part 40B face each other across a gap 12B of approximately 0.05 mm, and are staggered in the directions of the axis CL2.

The contact member 10B has the same spring characteristics as the contact member 10. When the contact member 10B is compressed in a direction to reduce its length (axial dimension), the strip-shaped part forming the trunk part 21B is elastically twisted so that the inside contact part 40B is displaced outward to come into contact with the outside contact part 30B.

Figure 10:
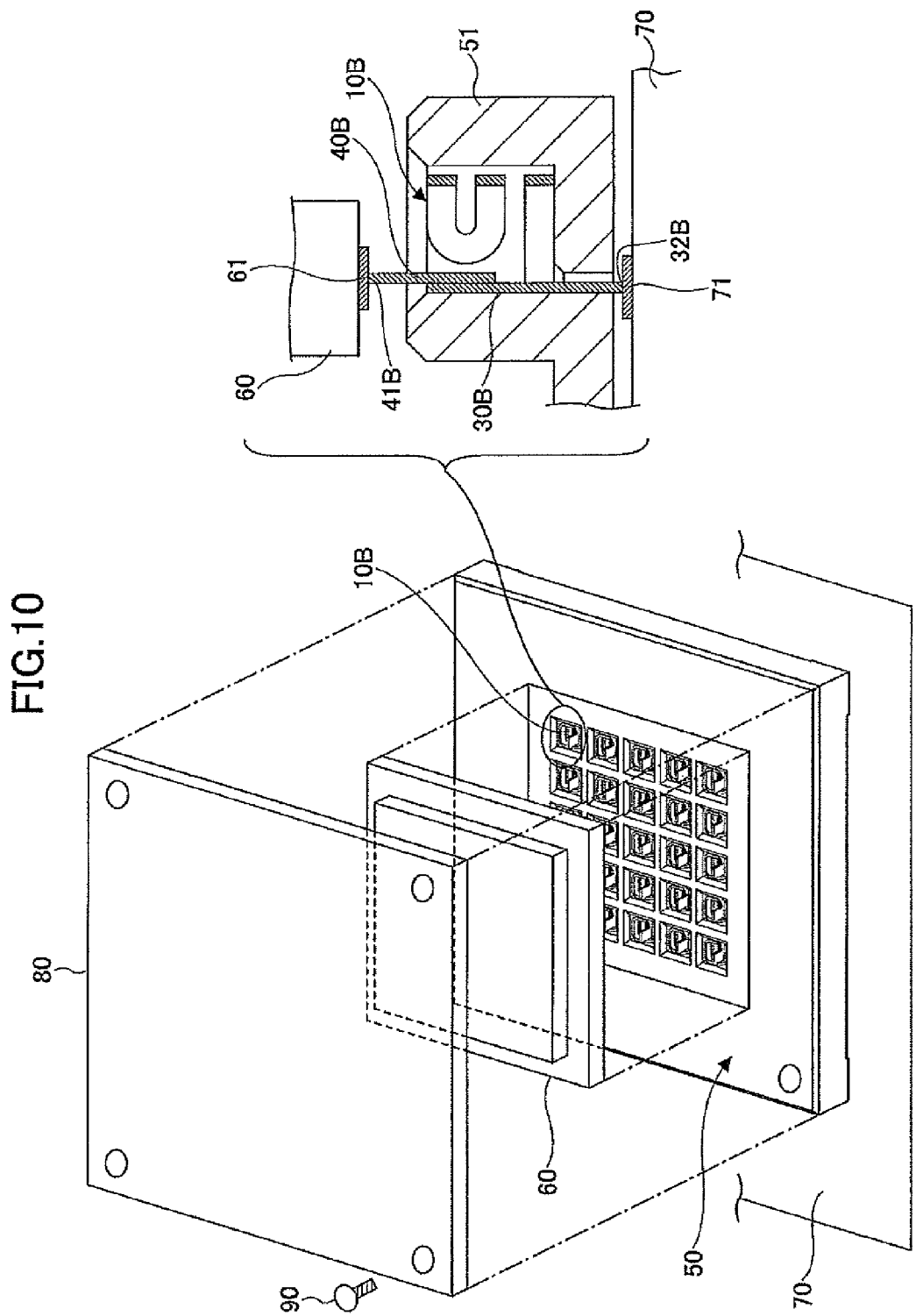
FIG. 10 is a perspective view showing an LGA IC package connector together with an LGA IC package, a printed circuit board, and a cover member according to the second embodiment of the present invention.
Figure 11C:
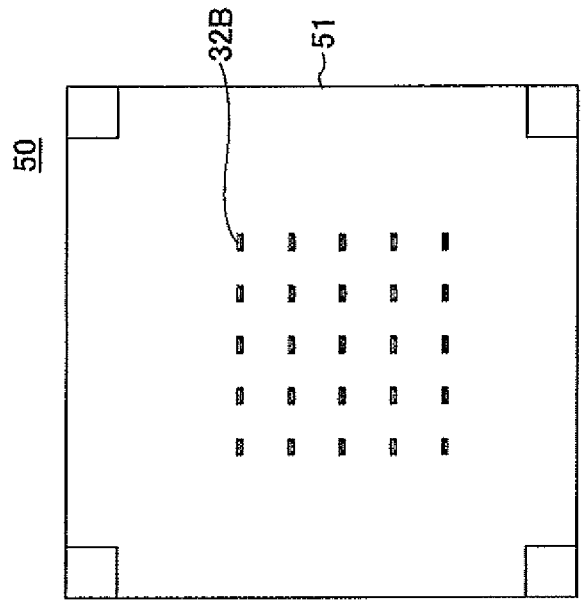
FIGS. 11A through 11D are diagrams showing the LGA IC package connector according to the second embodiment of the present invention.
Figure 11B:
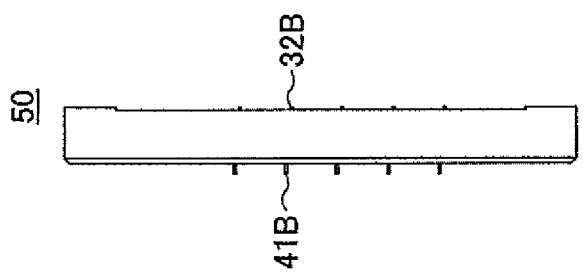
Figure 11A:
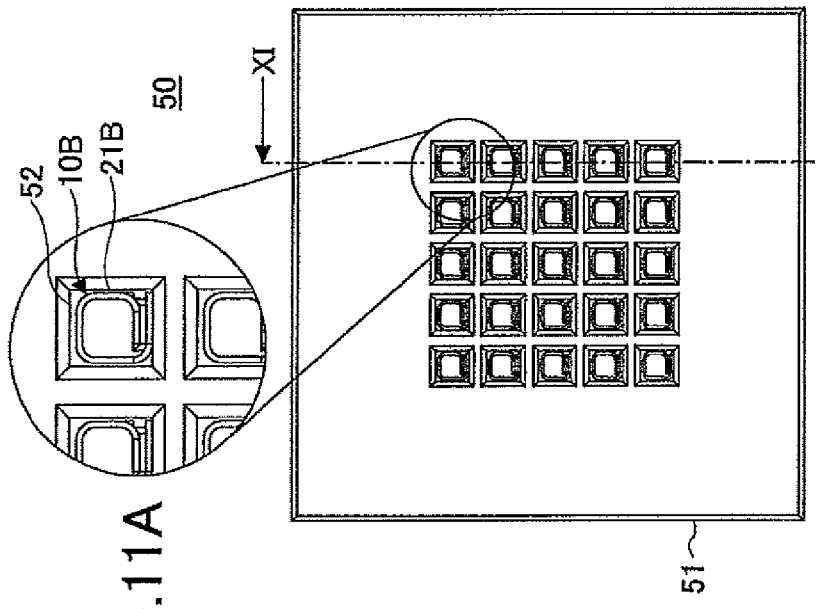
Figure 11D:
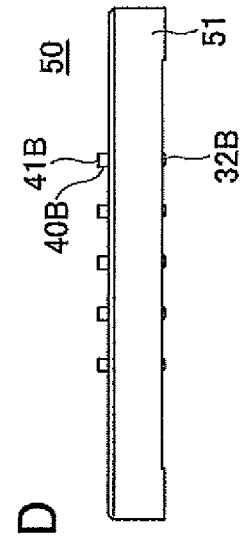
Figure 12:
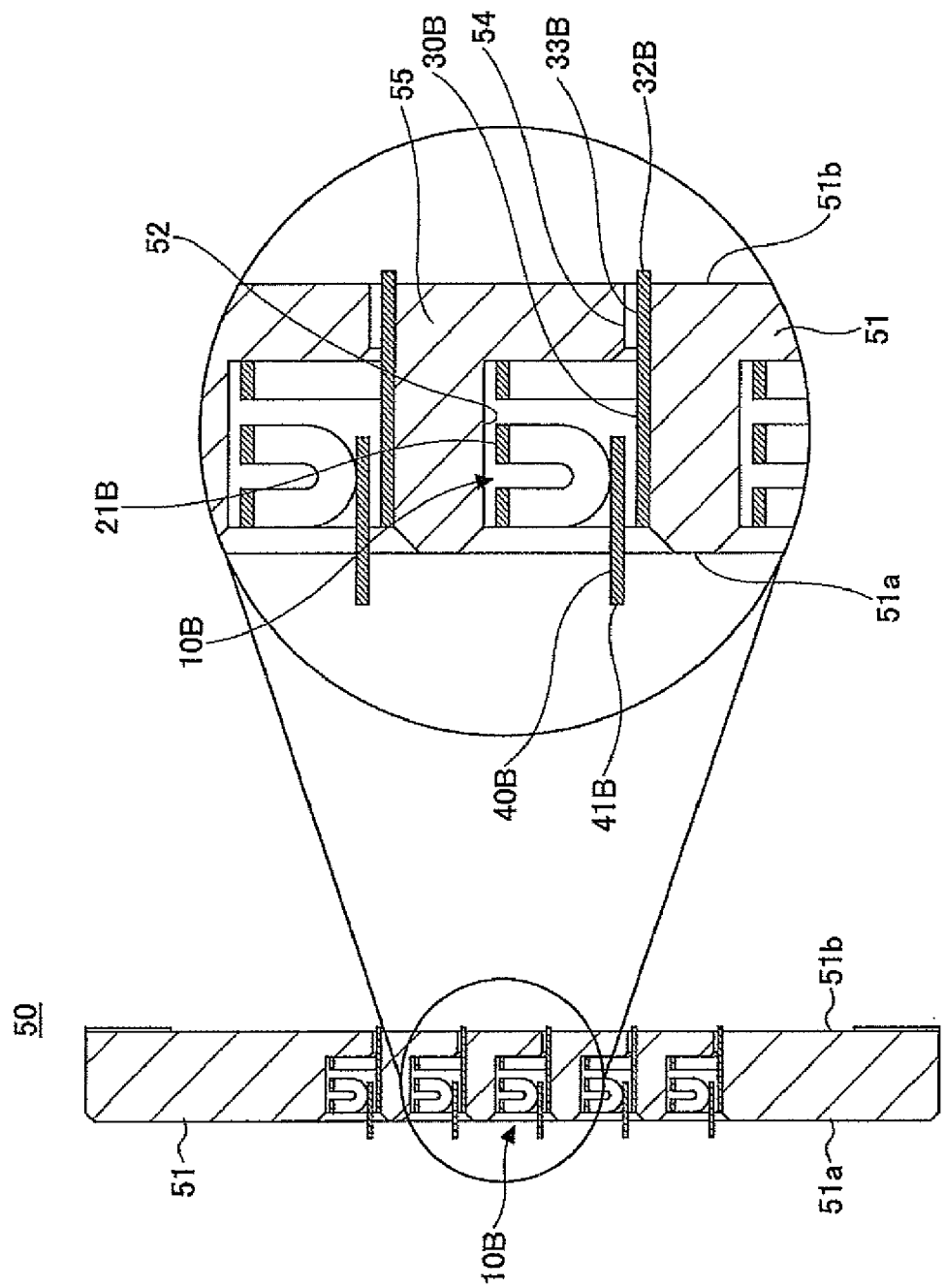
FIG. 12 is an enlarged cross-sectional view of the LGA IC package connector taken along the line XI-XI of FIG. 11A according to the second embodiment of the present invention.

This contact member 10B is used as, for example, a component that forms part of a connector for an LGA IC package (an LGA IC package connector) 50 shown in FIG. 10 through FIG. 12.

FIG. 10 is a perspective view showing the LGA IC package connector 50 together with an LGA IC package 60, a printed circuit board 70, and a cover member 80.

FIGS. 11A through 11D are diagrams showing the LGA IC package connector 50.

FIG. 12 is an enlarged cross-sectional view of the LGA IC package connector 50 taken along the line XI-XI of FIG. 11A.

The LGA IC package connector 50 includes a connector main body 51 shaped like a thin plate and multiple contact members 10B incorporated in the connector main body 51.

FIGS. 13A through 13D are diagrams showing the connector main body 51.

Figure 14:
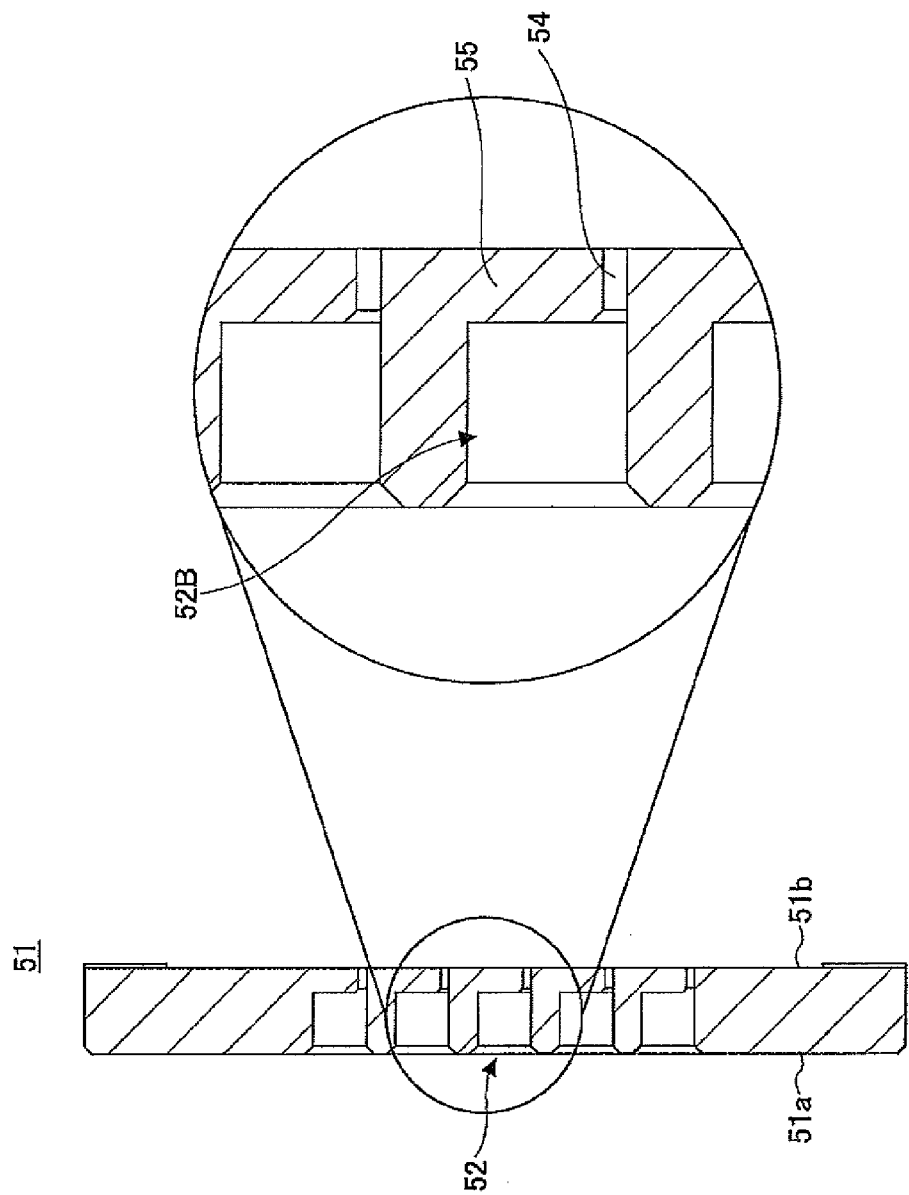
FIG. 14 is an enlarged cross-sectional view of the connector main body taken along the line XIII-XIII of FIG. 13A according to the embodiment of the present invention.

FIG. 14 is an enlarged cross-sectional view of the connector main body 51 taken along the line XIII-XIII of FIG. 13A.

Referring to FIGS. 13A through 13D and FIG. 14, the connector main body 51 has multiple contact member incorporation holes 52 aligned (arranged) in a matrix in a thin insulating plate. Each of the contact member incorporation holes 52 includes a substantially-square hole main opening 53 having a shape and size corresponding to the contact member 10B and a slit 54 provided through a bottom part 55 of the connector main body 51 so as to extend from one sidewall of the hole main opening 53. The slits 54 are arranged on the same side with respect to the hole main openings 53 arranged in a matrix.

Referring to FIG. 12, each contact member 10B is incorporated in the corresponding contact member incorporation hole 52, being contained in the hole main opening 53 with a leg part 33B press-fit into and through the slit 54.

An upper end 41B of the inside contact part 40B projects from an upper surface 51a of the connector main body 51, and a lower end 32B of the outside contact part 30B, that is, the end of the leg part 33B, projects from a lower surface 51a of the connector main body 51.

Thus, in the LGA IC package connector 50, the upper ends 41B of the inside contact parts 40B and the lower ends 31B of the outside contact parts 30B project from the upper surface 51a and the lower surface 51b, respectively, of the contact main body 51 to be arranged in a matrix.

This LGA IC package connector 50 is used as shown in FIG. 10. The LGA IC package connector 50 is placed on the printed circuit board 70, the LGA IC package 60 is mounted on the LGA IC package connector 50, and the cover member 80 is placed on the LGA IC package 60. Screw members 90 are provided through the cover member 80, the LGA IC package connector 50, and the printed circuit board 70 to be fitted with and secured by corresponding nuts (not graphically illustrated) on the lower surface side of the printed circuit board 70, so that the cover member 80, the LGA IC package 60, and the LGA IC package connector 50 are fastened onto the printed circuit board 70. Thereby, mounting of the LGA IC package 60 is completed. Each contact member 10B is pressed so that the inside contact part 40B comes into contact with the outside contact part 30B, the lower end 32B of the outside contact part 30B comes into contact with a corresponding pad 71 on the printed circuit board 70, and the upper end 41B of the inside contact part 40B comes into contact with a corresponding solder ball grid 61 on the lower surface of the LGA IC package 60. The contact member 10B has a linear signal transmission channel formed of the inside contact part 40B and the outside contact part 30B in contact with each other, so that the contact member 10B has an inductance on the order of magnitude of 1 nanoHenry (nH).

Third Embodiment

Figure 15:
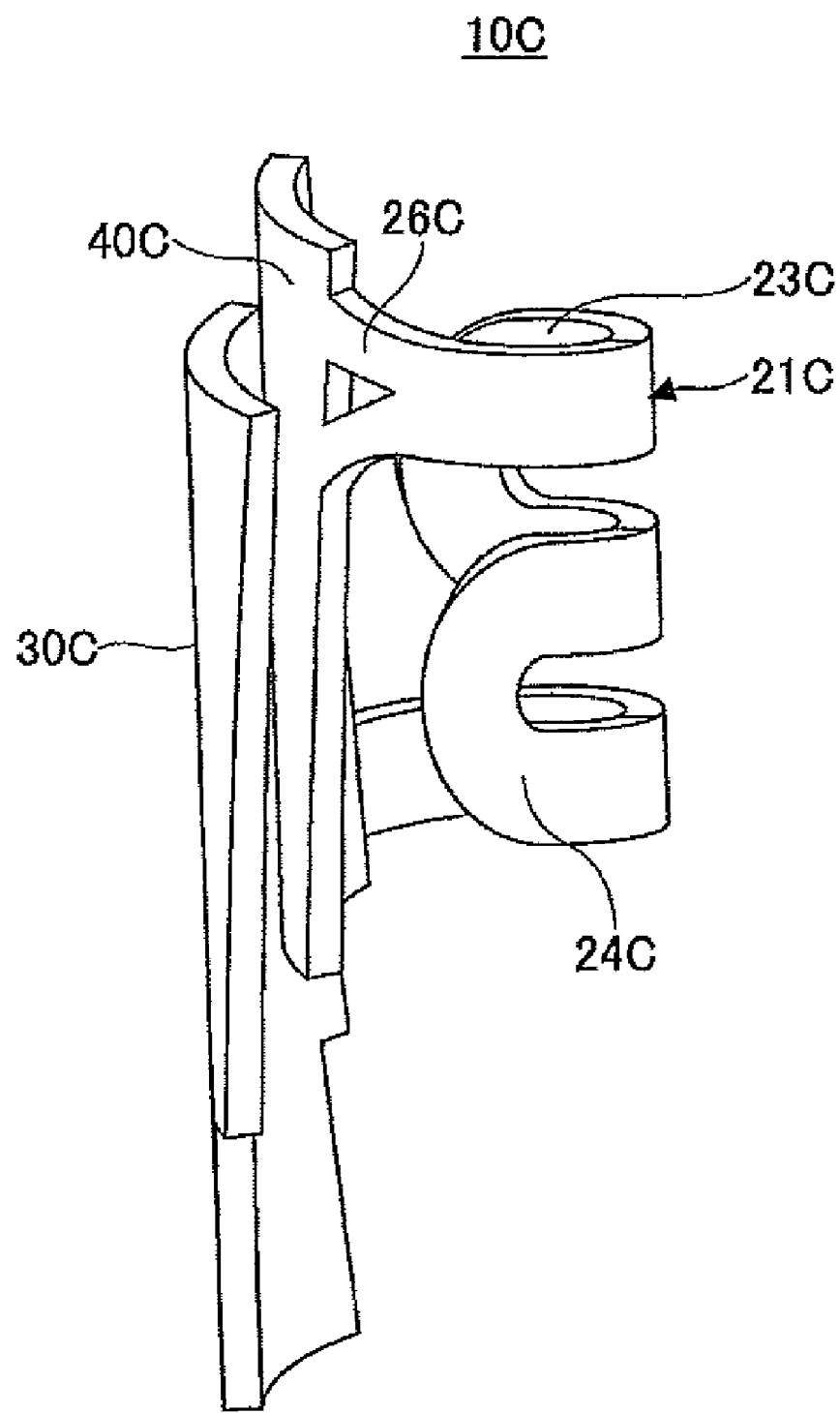
FIG. 15 is a perspective view of a contact member according to a third embodiment of the present invention.

FIG. 15 is a perspective view of a contact member 10C according to a third embodiment of the present invention. In FIG. 15, the elements corresponding to those shown in FIG. 2 are referred to by the same reference numerals with a suffix C.

Figure 16:
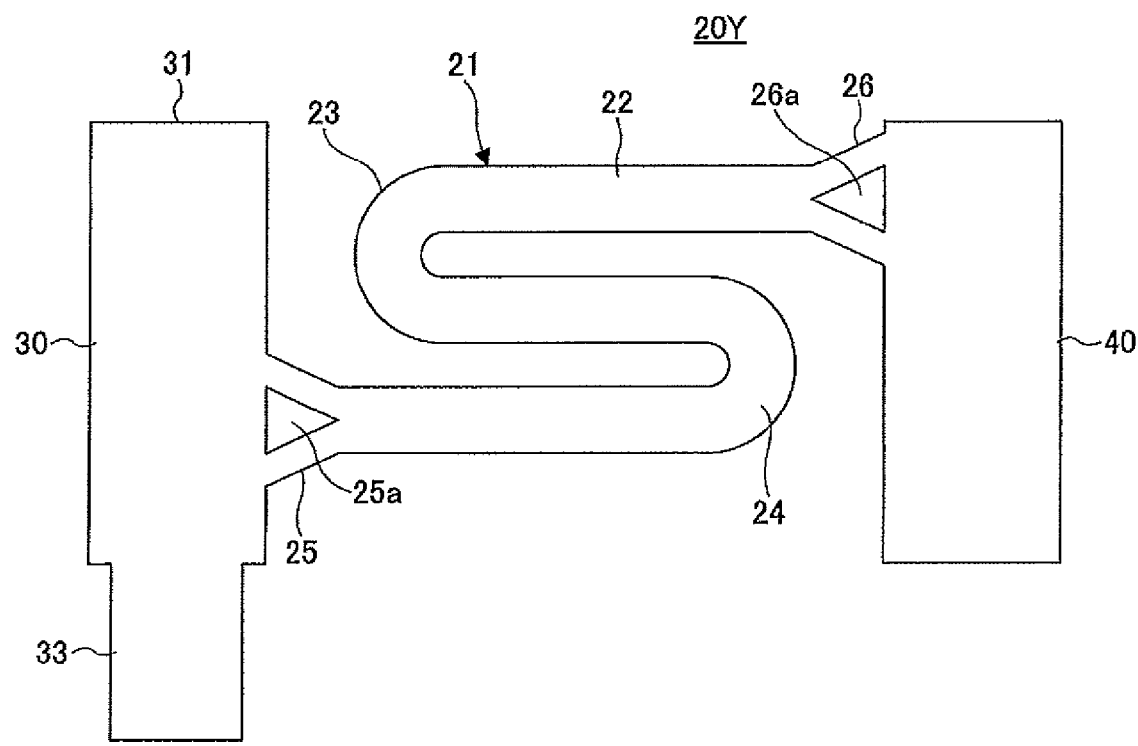
FIG. 16 is a diagram showing the contact member in a developed state according to the third embodiment of the present invention.

FIG. 16 shows a development of the contact member 10C.

The contact member 10C is formed by helically winding a developed plate member 20Y shaped as shown in FIG. 16 more than one turn the same as in the case of the first embodiment.

Referring to FIG. 15, the contact member 10C includes a trunk part 21C having turn-around parts 23C and 24C, an outside contact part 30C at one end of the trunk part 21C, and an inside contact part 40C at the other end of the trunk part 21C.

The developed plate member 20Y is different from the developed plate member 20 shown in FIGS. 5A and 5B in that the trunk part formation planned part 21 has tapered part 25 and 26 to serve as tapered parts 25C and 26C at the connections with the outside contact part formation planned part 30 and the inside contact part formation planned part 40, respectively, so as to make stress concentration less likely to occur therein. The tapered parts 25 and 26 have respective triangular openings 25a and 26a in the center.

The presence of the tapered parts 25C and 26C reduces stress concentration on each end of the trunk part 21C, so that the durability of the contact member 10C is increased compared with that of the contact member 10 of the first embodiment.

Fourth Embodiment

Figure 17A:
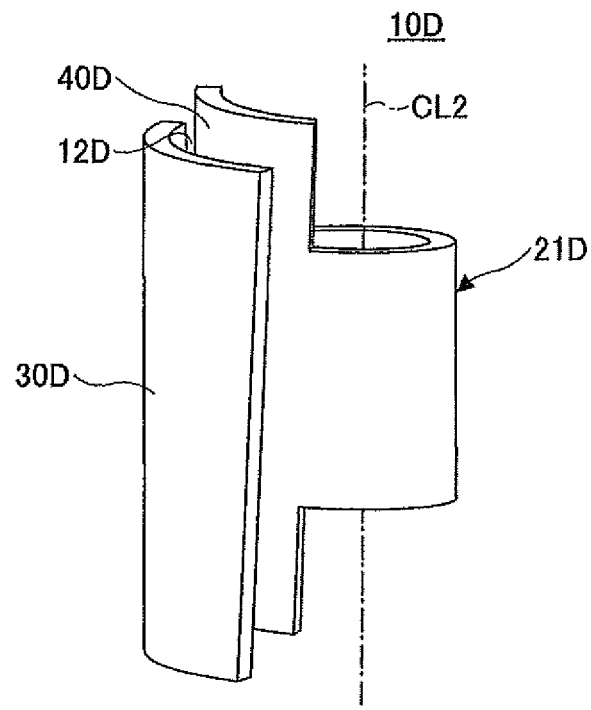
FIGS. 17A through 17C are diagrams showing a contact member according to a fourth embodiment of the present invention.
Figure 17B:
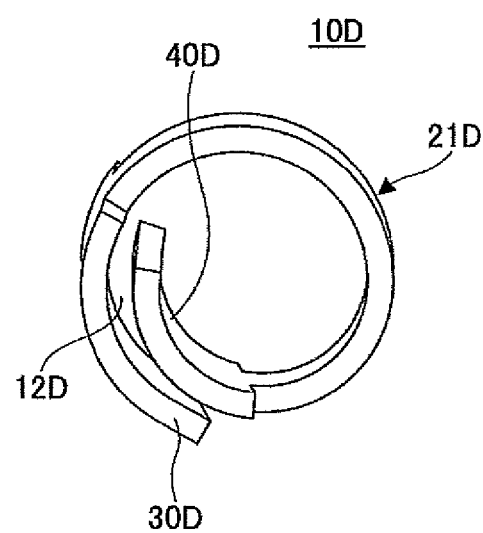
Figure 17C:
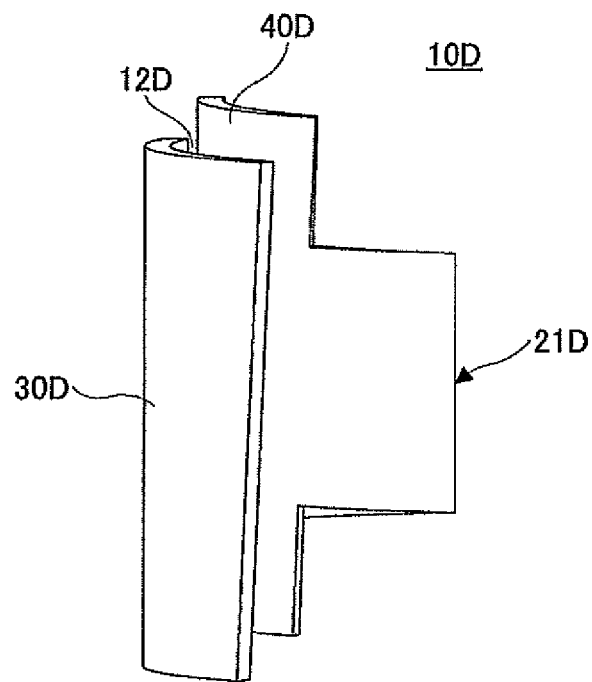

FIGS. 17A, 17B, and 17C are diagrams showing a contact member 10D according to a fourth embodiment of the present invention.

FIGS. 18A and 18B are diagrams showing a developed plate member 20Z.

The contact member 10D is formed by helically winding the developed plate member 20Z shaped as shown in FIGS. 18A and 18B more than one turn the same as in the case of the first embodiment. The contact member 10D includes a substantially annular trunk part 21D, an outside contact part 30D, and an inside contact part 40D. The outside contact part 30D and the inside contact part 40D face each other across a gap 12D of approximately 0.05 mm, and are staggered in the directions of the axis CL2.

The developed plate member 20Z has upper and lower cutout parts 110 and 111 formed therein, so that a trunk part formation planned part 21Z has a vertical (Z1-Z2) dimension H100 smaller than a vertical (Z1-Z2) dimension H200 of each of an outside contact part formation planned part 30Z and an inside contact part formation planned part 40Z. As a result, the spring constant of the contact member 10D is reduced compared with the case where the trunk part formation planned part has the same vertical dimension as the outside contact part formation planned part 30Z.

According to one embodiment of the present invention, a contact member is provided that includes a trunk part into which a strip-shaped part is formed substantially annularly, a first contact part at a first end of the trunk part, and a second contact part at a second end of the trunk part, the second contact part being positioned inside the first contact part, wherein the first contact part and the second contact part face each other, the strip-shaped part is configured to be elastically twisted to cause the second contact part to come into contact with the first contact part in response to the second contact part being pressed in a direction of the axis of the trunk part, and the strip-shaped part includes multiple turn-around parts between the first contact part and the second contact part.

According to one embodiment of the present invention, a connector is provided that includes a contact member including a trunk part into which a strip-shaped part is formed substantially annularly, a first contact part at a first end of the trunk part, and a second contact part at a second end of the trunk part, the second contact part being positioned inside the first contact part, wherein the first contact part and the second contact part face each other, the strip-shaped part is configured to be elastically twisted to cause the second contact part to come into contact with the first contact part in response to the second contact part being pressed in a direction of the axis of the trunk part, and the strip-shaped part includes multiple turn-around parts between the first contact part and the second contact part; and a connector main body including a hole part corresponding to the trunk part of the contact member, wherein the contact member is incorporated in the connector main body with the trunk part of the contact member being contained in the hole part.

According to the above-described contact member and the connector, the turn-around parts increase the overall length of the strip-shaped part without increasing the distance between the first (outside) contact part and the second (inside) contact part. Accordingly, when the second contact part is pressed in a direction of the axis of the trunk part until the second contact part comes into contact with the first contact part so that the strip-shaped part is elastically twisted, the strip-shaped part is less likely to cause plastic deformation. Therefore, the contact member enjoys good spring characteristics.

The present invention is not limited to the specifically disclosed embodiments, and variations and modifications may be made without departing from the scope of the present invention.

For example, the "annular" (cross-sectional) shape of the trunk part is not limited to a circularly or rectangularly annular shape, and may be a triangularly annular shape.

Further, the contact member 10B used in the LGA IC package connector 50 in the second embodiment may be replaced with the contact member 10, 10C, or 10D.

Further, according to the above-described embodiments, the contact member (10, 10B, 10C, 10D) may be configured to have the inside contact part (40A, 40B, 40C, 40D) and the outside contact part (30A, 30B, 30C, 30D) in slight contact with each other without a gap therebetween in a natural state where no external force is exerted on the contact member. That is, the inside contact part and the outside contact part at least face each other, and do not always have to be spaced from each other.

The present application is based on Japanese Priority Patent Application No. 2007-324955, filed on Dec. 17, 2007, the entire contents of which are hereby incorporated by reference.

What is claimed is:

1. A contact member, comprising:
   a trunk part into which a strip-shaped part is formed substantially annularly;
   a first contact part at a first end of the trunk part; and
   a second contact part at a second end of the trunk part, the second contact part being positioned inside the first contact part,
   wherein the first contact part and the second contact part face each other,
   the strip-shaped part is configured to be elastically twisted to cause the second contact part to come into contact with the first contact part in response to the second contact part being pressed in a direction of an axis of the trunk part, and
   the strip-shaped part includes a plurality of turn-around parts between the first contact part and the second contact part.

2. The contact member as claimed in claim 1, wherein the turn-around parts include a first turn-around part and a second turn-around part symmetrically positioned with respect to a line in a direction in which the first contact part and the second contact part face each other in a view in the direction of the axis of the trunk part.

3. The contact member as claimed in claim 1, wherein the trunk part has an S-letter shape in a developed state of the contact member.

4. The contact member as claimed in claim 1, further comprising a tapered part at each of connections between the trunk part and the first and second contact parts so as to make stress concentrations less likely to occur in the connections.

5. The contact member as claimed in claim 1, wherein the first contact part and the second contact part have respective first ends on a first side and have respective second ends on a second side,
- the first contact part and the second contact part are staggered so that the first end of the second contact part is positioned on the first side relative the first end of the first contact part, and
- the first contact part includes a leg part defined by the second end thereof.

6. The contact member as claimed in claim 1, wherein the trunk part has one of a circularly annular cross-sectional shape and a rectangularly annular cross-sectional shape.

7. A connector, comprising:
- a contact member including
  - a trunk part into which a strip-shaped part is formed substantially annularly;
  - a first contact part at a first end of the trunk part; and
  - a second contact part at a second end of the trunk part, the second contact part being positioned inside the first contact part,
  - wherein the first contact part and the second contact part face each other,
  - the strip-shaped part is configured to be elastically twisted to cause the second contact part to come into contact with the first contact part in response to the second contact part being pressed in a direction of an axis of the trunk part, and
  - the strip-shaped part includes a plurality of turn-around parts between the first contact part and the second contact part; and
- a connector main body including a hole part corresponding to the trunk part of the contact member,
- wherein the contact member is incorporated in the connector main body with the trunk part of the contact member being contained in the hole part.

8. The connector as claimed in claim 7, wherein the first contact part and the second contact part of the contact member have respective first ends on a first side and have respective second ends on a second side,
- the first contact part and the second contact part of the contact member are staggered so that the first end of the second contact part is positioned on the first side relative the first end of the first contact part,
- the first contact part includes a leg part defined by the second end thereof,
- the connector main body further includes a slit corresponding to the leg part of the first contact part of the contact member, and
- the contact member is incorporated in the connector main body with the trunk part of the contact member being contained in the hole part and the leg part of the first contact part of the contact member being fixed to the slit.

* * * * *